United States Patent
Gao

(10) Patent No.: US 11,882,670 B2
(45) Date of Patent: Jan. 23, 2024

(54) COOLING SYSTEM FOR SINGLE PHASE IMMERSED SERVERS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 83 days.

(21) Appl. No.: 17/565,893

(22) Filed: Dec. 30, 2021

(65) Prior Publication Data

US 2023/0217625 A1   Jul. 6, 2023

(51) Int. Cl.
*H05K 7/20* (2006.01)

(52) U.S. Cl.
CPC ..... *H05K 7/20236* (2013.01); *H05K 7/20254* (2013.01); *H05K 7/20272* (2013.01); *H05K 7/20772* (2013.01)

(58) Field of Classification Search
CPC .......... H05K 7/20236; H05K 7/20763–20781; H05K 7/20254; H05K 7/20272; H01L 23/473

See application file for complete search history.

(56) References Cited

U.S. PATENT DOCUMENTS

| | | | |
|---|---|---|---|
| 10,342,164 B2* | 7/2019 | So | H05K 7/20772 |
| 10,653,036 B1* | 5/2020 | Gao | H05K 7/20281 |
| 10,939,581 B1* | 3/2021 | Chen | H05K 7/20781 |
| 2009/0294106 A1* | 12/2009 | Flotta | H01L 23/4735 165/104.33 |
| 2022/0264768 A1* | 8/2022 | Horng | H05K 7/20327 |
| 2022/0322562 A1* | 10/2022 | Chehade | H05K 7/20336 |
| 2022/0322570 A1* | 10/2022 | Meneboo | H05K 7/20236 |
| 2023/0025254 A1* | 1/2023 | Curtis | H05K 7/20781 |
| 2023/0046075 A1* | 2/2023 | Chen | H05K 7/20272 |

* cited by examiner

*Primary Examiner* — Zachary Pape
(74) *Attorney, Agent, or Firm* — WOMBLE BOND DICKINSON (US) LLP

(57) ABSTRACT

In one embodiment, an immersion cooling system includes a container to contain first coolant received from a first cooling source and server chassis at least partially submerged into the first coolant. Each server chassis includes an electronic device and a cooling plate attached thereon to extract at least a portion of heat generated by the electronic device. The cooling plate includes an inlet port to receive second coolant from a second cooling source, a coolant channel to distribute the second coolant, and an outlet port to return the second coolant back to the second cooling source. The cooling system further includes a return manifold to be coupled to the second cooling source, the return manifold having one or more manifold return connectors respectively coupled with the server chassis and to receive and return the second coolant from the server chassis back to the second cooling source.

17 Claims, 8 Drawing Sheets

COOLING SYSTEM FOR SINGLE PHASE IMMERSED SERVERS

FIELD OF THE DISCLOSURE

Embodiments of the present invention relate generally to data centers. More particularly, embodiments of the invention relate to a system for single phase immersed servers.

BACKGROUND

Thermal management of a data center that includes several active electronic racks is critical to ensure proper performance of servers and other IT equipment operating in the racks. Without proper thermal management the thermal environment within the racks may exceed operational thresholds, resulting in operational consequences (e.g., servers failing, etc.). One way to manage the thermal environment is the use of cooling air to cool the IT equipment. A majority of existing data centers are air cooled. Recently, data centers have been deploying more high-power density electronic racks, where more high density chips are packaged closer together to provide more processing power. Cooling these high-density racks by maintaining a proper thermal environment may be a challenge with existing cooling systems, especially within the constant increasing power density of the racks.

Existing solutions for single phase immersion systems only consider rack level fluid recirculation without any local cooling acceleration. Therefore, the existing solutions do not account for different power density applications and configurations in a rack. The existing solutions also provide for untargeted and limited cooling capabilities through immersion in a fluid external to server enclosures.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
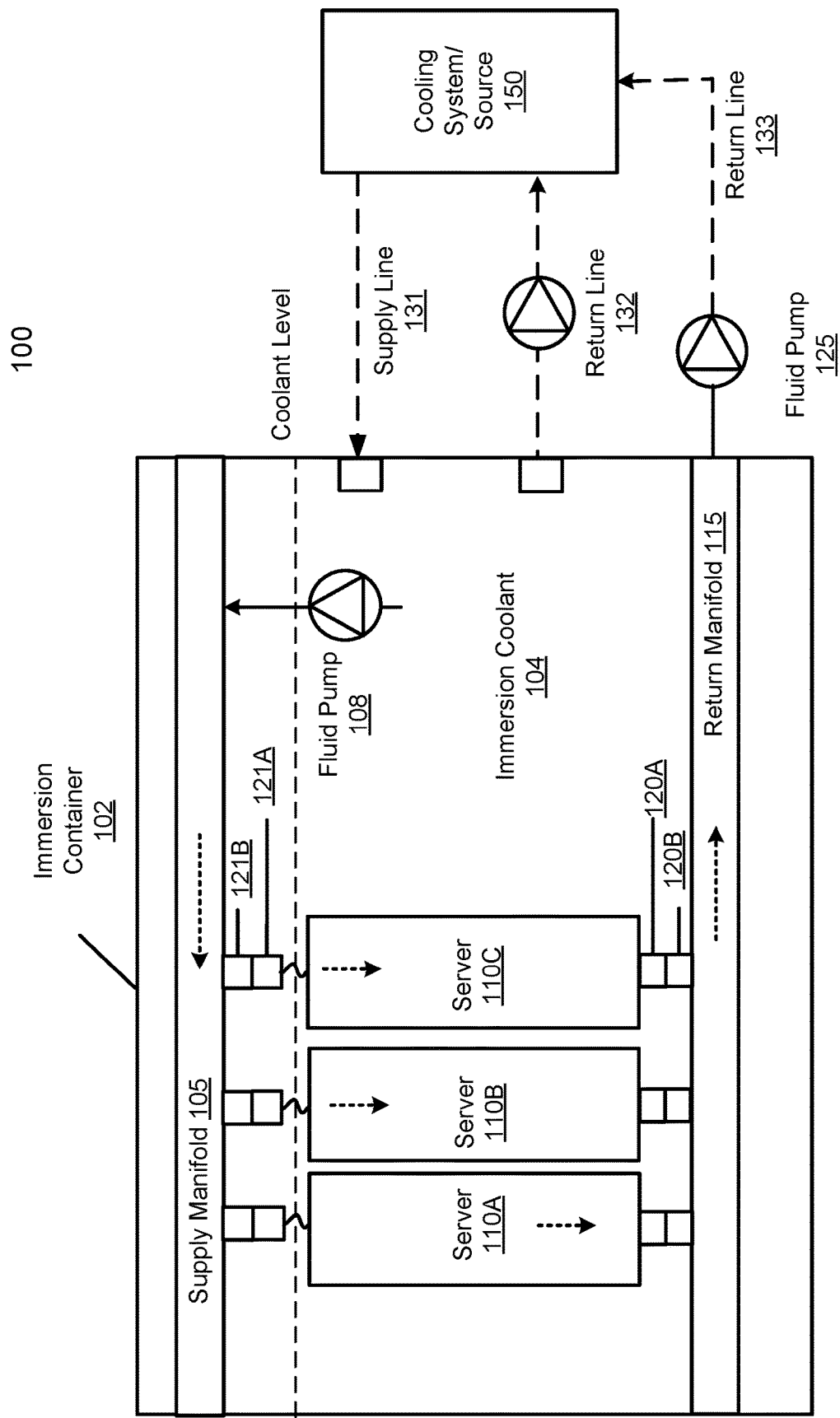
FIG. 1 is a system diagram illustrating a cooling design of an immersion tank with supply manifold for server cooling loops, according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the present disclosure provide localized cooling loops for servers within a single phase immersion cooling system. The design of the immersion system may be implemented for electronics racks and clusters. The cooling architecture can include immersion tank based computing clusters. The design includes a built in manifold in an IT enclosure (e.g., an immersion tank). The manifold can include connectors (e.g., blind mating connectors) to connect servers populated to the enclosure. The servers can include cooling modules with internal cooling channels for providing localized cooling within the servers populated to the enclosure. In one embodiment, the servers may be connected to a second manifold (e.g., a supply manifold) from the top of the servers to receive coolant. In another embodiment, the servers may include an opening to directly intake coolant from the enclosure (e.g., from the fluid in which the servers are immersed). In one embodiment, the second manifold is connected with a second coolant source (e.g., an external coolant source). In another embodiment, the second manifold is designed with an intake that pulls directly from the enclosure (e.g., from the fluid in the immersion tank). The servers are designed with fluid inlet ports to receive a fluid either from the second manifold or directly from the coolant in the immersion tank.

Embodiments of the present disclosure may thus enable the management of immersion cooling for different servers with different heat loads in an immersion system. Thus, the system may provide for targeted cooling of hot spots and high density chips in an immersion cooling system. Additionally, the system provides for the flexibility to use one single phase coolant for all cooling loops in the system and in the immersion tank or separate cooling liquids for the server cooling loops and the immersion tank.

According to one aspect, an immersion cooling system includes a container to contain first coolant therein that is received from a first cooling source and one or more server chassis at least partially submerged into the first coolant. Each of the server chassis includes an electronic device and a cooling plate attached to the electronic device is to extract at least a portion of heat generated by the electronic device. The cooling plate includes an inlet port to receive second coolant from a second cooling source, a coolant channel to distribute the second coolant, and an outlet port to return the second coolant back to the second cooling source. The cooling system further includes a return manifold to be coupled to the second cooling source, the return manifold having one or more manifold return connectors respectively coupled with the server chassis and to receive and return the second coolant from the server chassis back to the second cooling source.

In one embodiment, each of the manifold return connectors is configured to engage and connect with an outlet port of a cooling plate of a corresponding server chassis when the corresponding server chassis is submerged into the first coolant downwardly onto the return manifold. Each outlet port of each cooling plate includes a plate return connector, and each plate return connector and each manifold return connector are blind mate connectors.

In one embodiment, the container further includes a main inlet port to be coupled to the first cooling source via a coolant supply line to receive the first coolant from the first cooling source and a main outlet port to be coupled to the first cooling source via a coolant return line to circulate the first coolant back to the first cooling source. The return manifold is disposed submerged in the first coolant and located near a bottom of the container and underneath the server chassis.

In one embodiment, the system further includes a supply manifold disposed above the server chassis to receive the second coolant from the second cooling source. The supply manifold includes one or more manifold supply connectors, each being coupled to an inlet port of a cooling plate of the server chassis to supply the second coolant to the server chassis. The system further includes a first fluid pump coupled between the supply manifold and the second cooling source to pump the second coolant into the supply manifold. The first fluid pump is configured to receive and pump the second coolant from the first coolant contained within the container.

In one embodiment, the system further includes a second fluid pump disposed between at least one cooling plate and the supply manifold to pump the second coolant from the supply manifold to a corresponding server chassis. The system may further include a plate supply connector coupled to an inlet port of each cooling plate via a flexible hose. The plate supply connector is capable of being connected with one of the manifold supply connectors of the supply manifold. The first cooling source and the second cooling source are the same cooling source, which is external to the container. The inlet port of each cooling plate is submerged into the first coolant contained within the container to receive a portion of the first coolant as the second coolant.

According to another aspect, a server chassis for immersion cooling includes a server frame, a printed circuit board (PCB) mounted on the server frame, the PCB having one or more electronic devices mounted thereon; and one or more cooling plates respectively attached to the one or more electronic devices to extract heat generated from the electronic devices. The sever frame, the PCB having the electronic devices, and the cooling plates are to be submerged into first coolant received from a first cooling source and contained within an immersion tank. Each of the cooling plate includes an inlet port to receive second coolant from a second cooling source, a coolant channel to distribute the second coolant, and an outlet port to return the second coolant back to the second cooling source. The outlet port is to be coupled to a return manifold within the immersion tank that is coupled to the second cooling source. The return manifold includes a manifold return connector to be coupled with the outlet port and to receive and return the second coolant from the cooling plate back to the second cooling source.

According to one embodiment, the manifold return connector is configured to engage and connect with the outlet port of the cooling plate when the server chassis is submerged into the first coolant downwardly onto the return manifold. The outlet port comprises a plate return connector, and wherein the plate return connector and the manifold return connector are blind mate connectors that can engage and connect with each other. The inlet port of the cooling plate is coupled to a plate supply connector via a flexible hose and the plate supply connector can be connected with a supply manifold to receive the second coolant.

According to a further aspect, a cooling plate for immersion cooling includes a base plate to be attached to an electronic device of a server chassis, wherein the sever chassis having the electronic device is to be submerged into first coolant received from a first cooling source and contained in an immersion container, an inlet port to receive second coolant from a second cooling source, a coolant channel to distribute the second coolant, and an outlet port to return the second coolant back to the second cooling source. The outlet port is to be coupled to a return manifold within the immersion container that is coupled to the second cooling source. The return manifold includes a manifold return connector to be coupled with the outlet port and to receive and return the second coolant from the cooling plate back to the second cooling source.

In one embodiment, the manifold return connector is configured to engage and connect with the outlet port when the server chassis is submerged into the first coolant downwardly onto the return manifold. The outlet port comprises a plate return connector, and the plate return connector and the manifold return connector are blind mate connectors that can engage and connect with each other. The inlet port is coupled to a plate supply connector via a flexible hose, and wherein the plate supply connector can be connected with a supply manifold to receive the second coolant.

FIG. 1 shows a cooling system design including an immersion tank with a fluid supply manifold designed with a direct intake loop from the coolant in the immersion tank reservoir. The cooling system may use an immersion fluid in which entire servers are submerged in the immersion coolant. Each server may be connected with a return manifold via one or more blind mating connectors. The return manifold may be disposed near the bottom of the immersion tank including or being coupled to a pump to move the fluid flowing through the loop. In the depicted example as shown in FIG. 1, each server connects to a supply manifold and the direct intake loop of the supply manifold is used for accelerating the fluid stream from the immersion tank reservoir (also referred to as an immersion container or coolant container) to internal fluid channels of the individual servers as part of localized cooling to the server. The servers are integrated with cooling modules (also referred to as cooling plates or cold plates) with internal fluid channels. The fluid is accelerated through the cooling modules and the internal fluid channels (e.g., via the pump). Accordingly, the fluid flows through the immersion tank reservoir (as part of global immersion cooling) as well as through the internal fluid channels and cooling modules of the servers (as part of localized cooling).

In one embodiment, referring to FIG. 1, the cooling system 100 includes an immersion container 102 filled with an immersion cooling liquid 104 for cooling one or more servers 110A-C populated to the immersion cooling tank 102 by vertically inserting each server into a specific server slot from the top of immersion container 102. Note that immersion container 102 may also be referred to as an immersion tank. The terms of an immersion container and an immersion tank are interchangeable terms through this application. The immersion cooling liquid 104 may be a single-phase coolant. The system 100 may further include a supply manifold 105 disposed near the top of immersion container 102 and a return manifold 115 disposed near the bottom of immersion container 102.

The servers 110A-C populated to the immersion cooling tank 102 may be coupled to the return manifold 115 via blind mating connectors. The servers 110A-C may also be coupled to the supply manifold via manual connectors, blind mating connectors, or any other fluid connection such as manual mating connectors. As depicted, the supply manifold 105, the servers 110A-C and the return manifold 115 may make up one or more cooling loops through which a coolant can flow within a cooling plate (not shown) attached to an electronic device of a server to extract heat from the electronic device of the server, while immersion coolant 104 in which the server is submerged circulates surrounding the exterior surfaces of the components of the server such as exterior surfaces of the electronic device and the cooling plate.

According to one embodiment, return manifold 115 includes an array of manifold return connectors, such as manifold return connector 120B, disposed spaced apart along the manifold and facing upwardly. Each of the manifold return connectors defines a server slot in which a server chassis having a server therein, such as servers 110A-110C, can be inserted downwardly from the top of immersion container 102 to be coupled with a corresponding manifold return connector. Note that although there are three servers shown, more or fewer servers may also be applied here.

In one embodiment, each of servers 110A-110C includes a server return connector coupled to an outlet port of a cooling plate that is attached to an electronic device of the server (e.g., a processor). Details of the server structure and the cooling plate will be described further below. According to one embodiment, both server return connectors and manifold return connectors are counterpart blind mate connectors. When a server is deposited downwardly in a server slot, the server return connector and the corresponding manifold return connector of return manifold 115 will automatically engage and connect to establish a fluid connection between the cooling plate and the return manifold 115.

For example, server chassis 110C includes a cooling plate attached to an electronic device within server chassis 110C (not shown). Server return connector 120A, for example, a blind mate connector, is disposed and coupled to an outlet port of the cooling plate. When server chassis 110C is deposited downwardly into a server slot corresponding to manifold return connector 120B, server return connector 120A automatically engages and connects with manifold return connector 120B when they contact with each other. Other server chassis such as server chassis 110A-110B may have the same or similar structure or configuration as of server chassis 110C.

In addition, according to one embodiment, supply manifold 105 includes an array of manifold supply connectors, such as manifold supply connector 121B, facing downwardly along the supply manifold. Each manifold supply connector corresponds to one of the server slots. Each server chassis includes a server supply connector, such as server supply connector 121A, coupled to an inlet port of a cooling plate attached to an electronic device within the server chassis. A server supply connector may be coupled to an outlet port of a cooling plate via a flexible hose. The server supply connector can be connected to a manifold supply connector corresponding to the server slot. Supply manifold 105 may be mounted as part of the lid of immersion container 102.

In one embodiment, fluid pump 125 may be coupled to the return manifold 115 to accelerate a coolant through the supply manifold 105, the servers 110A-C, the return manifold 115, and then to external cooling source or cooling system 150 via return line 113. In some embodiments, the supply manifold 105 may include a pump 108 to directly intake some of the coolant 104 into supply manifold 102. In an embodiment, the accelerated coolant flowing through server chassis 110A-110C is 100% from the immersion coolant 104 pumped by pump 108. Accordingly, the immersion cooling liquid 104 may be used for both external immersion cooling of the servers 110A-110C as well as direct and local cooling through cooling modules incorporated within the servers 110A-110C.

Furthermore, immersion container 102 further includes a main inlet port to be coupled to main supply line 131 to receive the immersion coolant 104 from the external cooling source or cooling system 150. Immersion container 102 may further include a main outlet port to be coupled to main return line 132 to circulate at least some of the immersion coolant 104 back to cooling source or cooling system 150 to form a main or global immersion cooling loop. The cooling loop from immersion coolant 104, to supply manifold 105, through any one of the servers, to return manifold 115, to external cooling source 150 via path 133, and then to immersion coolant 104 via path 131 is referred to as a localized cooling loop. Thus, each server chassis is associated with its own localized cooling loop.

Note that the pump speeds of pumps 108 and 125 may be controlled, for example, by a controller, independently, while the fluid flow rates on supply line 131 and return line 132 may also be controlled differently. An additional pump may be disposed on supply line 131 and/or return line 132. The fluid flow rates of localized loops may be controlled based on the local temperatures within the cooling plates of the server chassis. The fluid flow rate of the global immersion cooling loop may be determined based on global temperature within immersion coolant 104 as well as the fluid level/coolant level.

Figure 2:
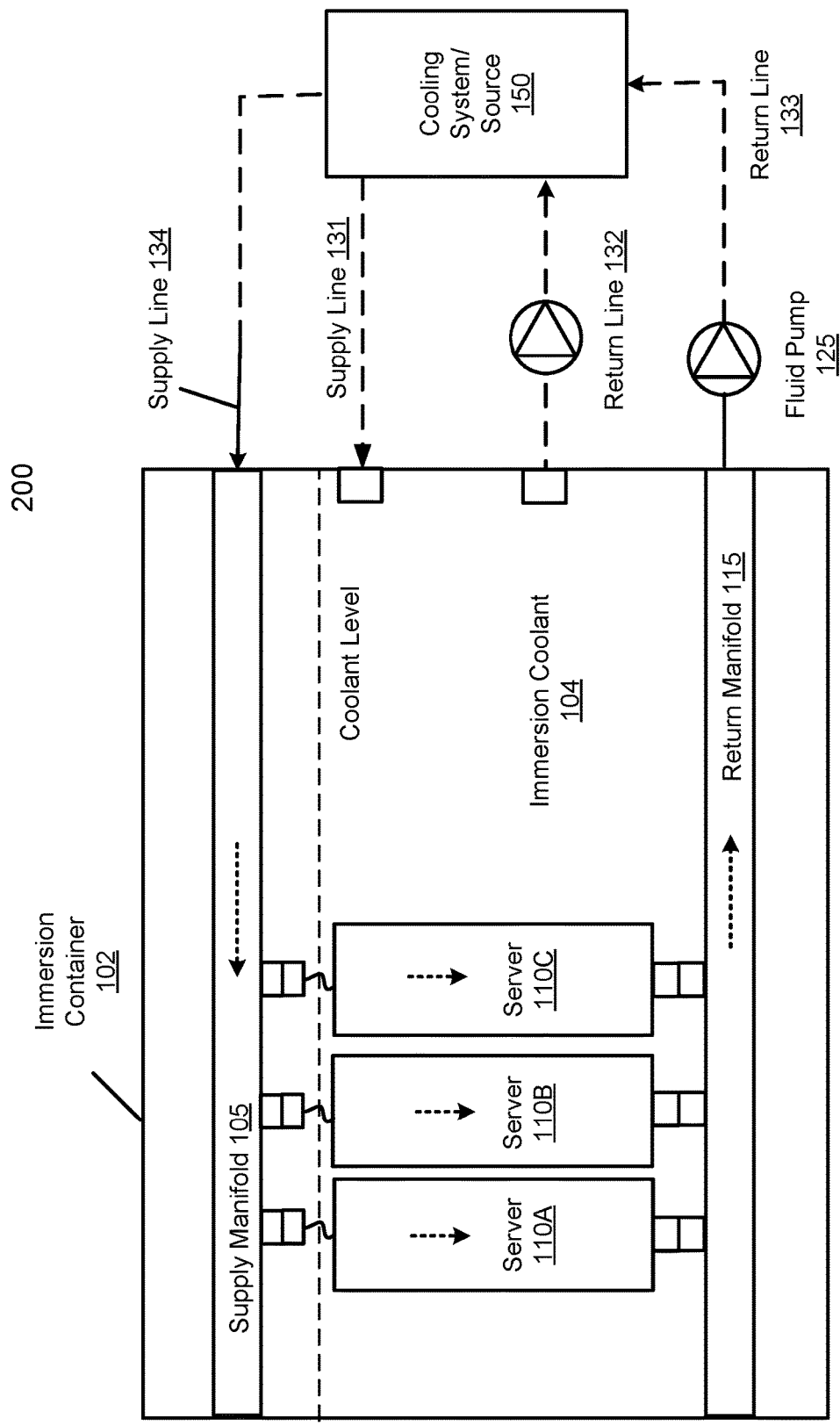
FIG. 2 is a system diagram illustrating a cooling design of an immersion tank with supply manifold for a separate liquid cooling loop, according to one embodiment.

FIG. 2 shows a system design with a supply manifold connected to a separate fluid loop from the immersion tank. The depicted design provides for different fluids and different flow rates through the internal fluid channels of the servers and the immersion tank. The immersion tank coolant is used for external cooling of the servers by submerging the servers in the coolant and the individual servers, packaged with the cooling module, connect with the supply and return manifolds for thermal management via a second fluid being pumped through the internal fluid channels of the servers.

In one embodiment, referring to FIG. 2, cooling system 200 may differ from cooling system 100 of FIG. 1 in that the supply manifold 105 may include a full loop single phase input rather than a direct input from the immersion cooling liquid in the immersion cooling tank 102. For example, the supply manifold 105 may receive a coolant from an external source, in this example, cooling source 150 via supply line 134. Note that in this example, the first coolant 104 in the global cooling loop via paths 131-132 and the second coolant in the localized cooling loop via paths 133-134 may be drawn from the same cooling source 150.

In another embodiment, the second coolant for the localized cooling may be provided by a different cooling source other than cooling source 150. For example, the second coolant may be a single-phase coolant while the first coolant may be a two-phase coolant. The two-phase coolant, when its temperature arises, may turn from a liquid form into a vapor. When the temperature drops, the vapor may be transform back to a liquid form. In the configuration in which first coolant 104 is a two-phase coolant, the main outlet port and return line 132 may be positioned above the coolant level, such that the vapor can be collected. A local condenser may be implemented within immersion container 102 and above the coolant level to condense the vapor back to the liquid form locally.

Figure 3A:
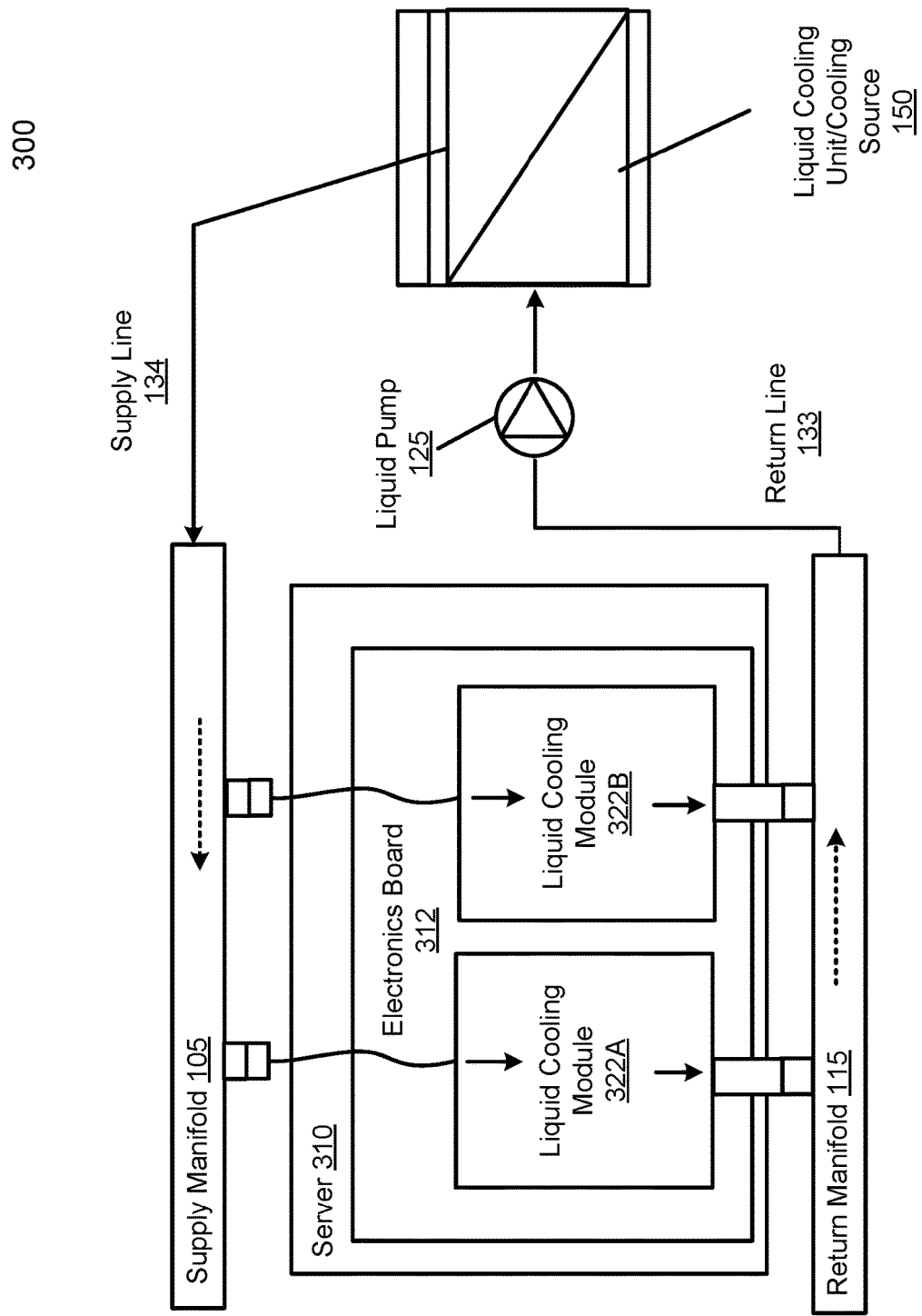
FIG. 3A shows a server design including internal cooling modules in a complete cooling loop, according to one embodiment.

FIG. 3A shows a server design and fluid flow illustrated in a complete fluid loop of the design according to one embodiment. The servers include one or more cooling modules attached to their respective electronic devices to extract the heat generated by the electronic devices. The cooling modules include fluid connectors used to connect with a supply manifold and a return manifold disposed within an immersion container. The cooling modules may include blind mating connectors and/or manual mating connectors. The servers include a separate stream of fluid pumped through the return manifold.

In one embodiment, referring to FIG. 3A, a cooling system 300 may include a server 310 including an electronics board 312 (e.g., a printed circuit board or PCB) and liquid cooling modules 322A-332B (e.g., cooling plates). The electronics board 312 may include electronic devices such as one or more processors (e.g., central processing units, graphics processing units, etc.). In some examples, the electronic devices of the electronics board 312 may include high power density processors that produce relatively large amounts of heat. The liquid cooling modules 322A-B may be cooling devices that are placed in thermal contact with the electronic device to extract heat from the electronic devices via a liquid coolant.

The cooling system 300 may further include at least a built-in return manifold 115 for connecting the liquid cooling modules 322A-332B of the server 310 (e.g., via blind mating connectors) to a cooling loop. In some examples, the liquid cooling modules 322A-332B may be coupled to a supply manifold 105 via manual connectors. In an alternative embodiment, the liquid cooling modules 322A-332B include a direct input opening to receive a liquid coolant directly from an immersion tank reservoir. The cooling system 300 may further include a complete cooling loop with a liquid cooling unit 150 and a liquid pump 125 to circulate the coolant through the cooling loops of the liquid cooling modules 322A-332B. The cooling system 300 may be a liquid to liquid cooling unit, liquid to air cooling unit, or any other single phase cooling unit.

Figure 3B:
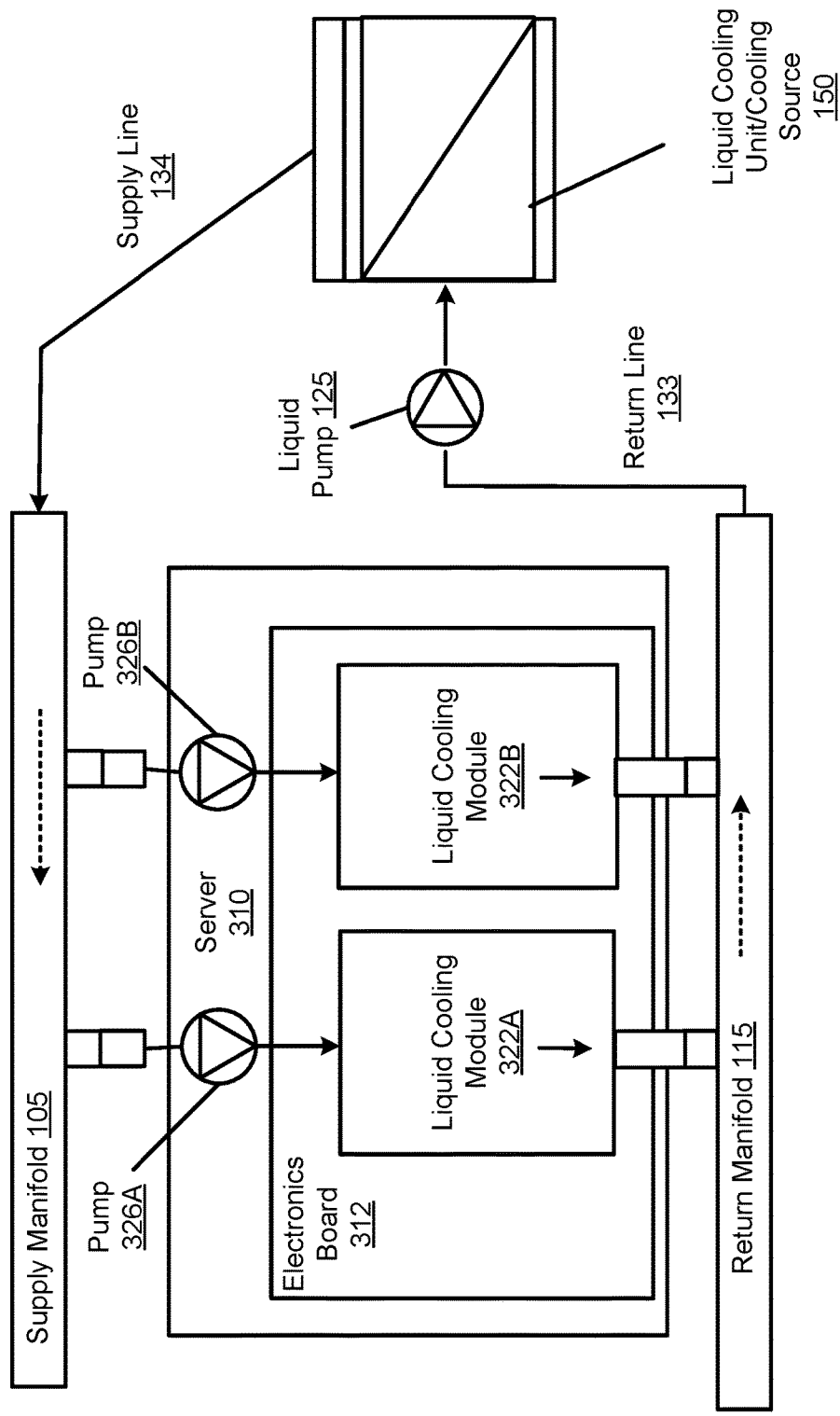
FIG. 3B is a server design including localized pumps for internal cooling modules of the server within an immersion cooling system, according to another embodiment.

FIG. 3B shows a server design with localized fluid pumps in each loop of the internal fluid channels, according to some embodiments. The localized pumps in each loop enable different cooling capacities for different channels, cooling modules, and servers to provide for cooling of different power density applications.

Similar to FIG. 3A, the cooling system 350 of FIG. 3B includes a server 410, electronics board 312, liquid cooling modules 322A-322B, and a return manifold 115. In addition, the cooling system 350 includes a localized liquid pump, such as pumps 326A-326B, associated with each of the liquid cooling modules 322A-322B. Accordingly, a localized liquid pump may be used to provide targeted cooling capacity to each of the liquid cooling devices 322A-322B depending on the power density of the electronics being cooled by the liquid cooling modules 322A-322B.

For example, the liquid cooling device 322A may be in contact with a very high power density processor while the liquid cooling device 322B may be in contact with a lower power density electronic device. Accordingly, the localized liquid pump 326A may be controlled to provide more coolant through the liquid cooling device 322A than the liquid cooling module 322B. Thus, the flow rate of the coolant for localized cooling may be individually controlled dependent upon the specific operating condition, such as a local temperature of an individual cooling module or an electronic device. A liquid pump 125 may also be coupled to the return manifold 115 to accelerate the coolant from the liquid cooling modules 322A-322B through the return manifold 115 and back to the liquid cooling unit or cooling source 150. Each of the individual pumps 326A-326B can be adjusted to provide more localized cooling fluid acceleration, for example, based on the temperature of the coolant, the cooling plate, and/or the electronic device. FIG. 3B shows that the supply manifold is connected with a supply line 134 coupled to external cooling source/cooling system 150. In an embodiment, the supply maniold 105 can be connected to the coolant contained in the immersion tank, such as immersion coolant 104 of immersion tank 102 as shown in FIG. 1, with or without pump 108.

Figure 4:
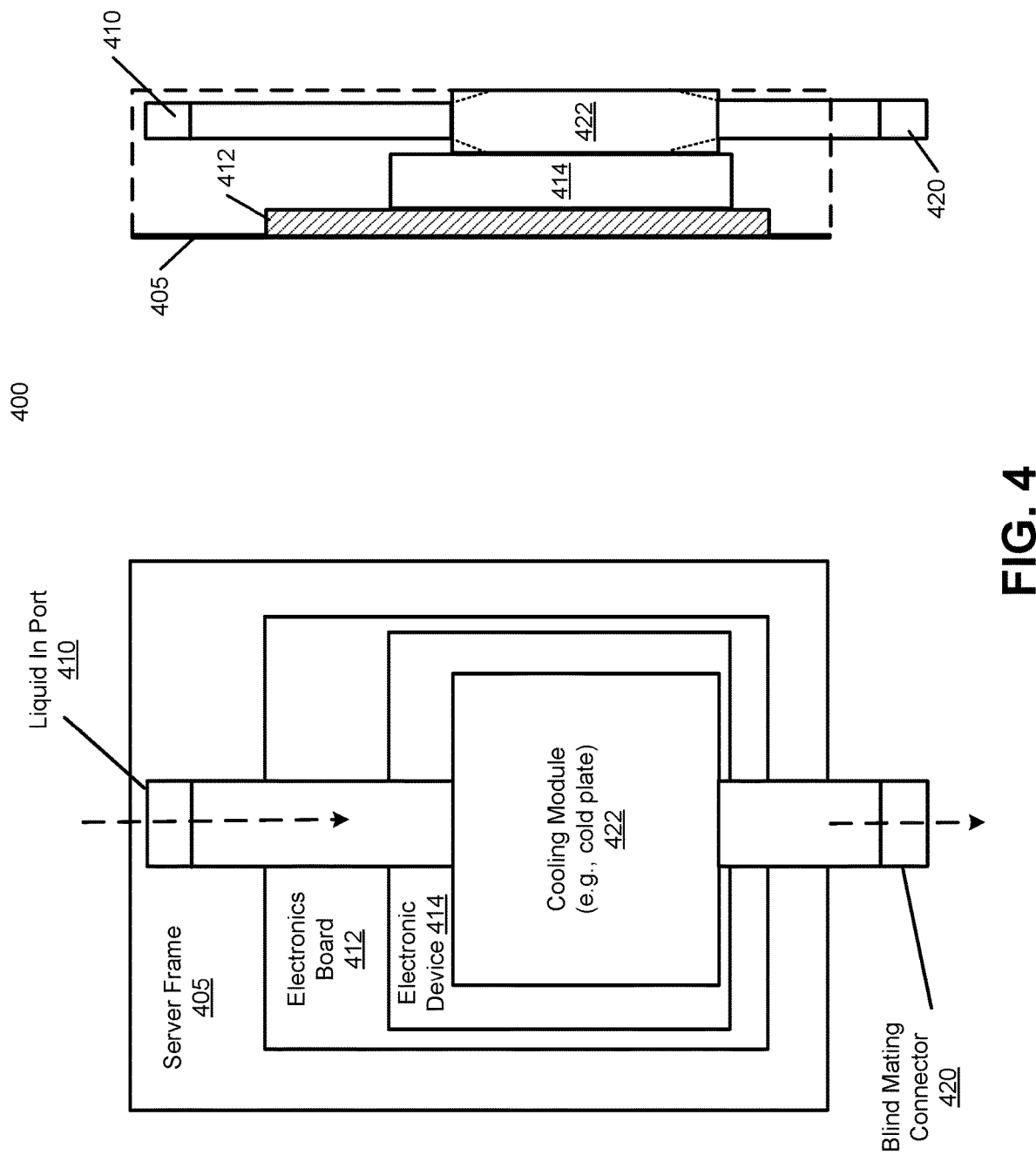
FIG. 4 shows a server chassis design according to one embodiment.

FIG. 4 depicts a server and internal server cooling module design, according to some embodiments. As depicted, the server cooling module may include liquid out ports with blind mating connectors disposed at the bottom and used for connecting the servers and the internal fluid channels of the servers with the return manifold. Additionally, the cooling module includes a liquid in port that is a directly open port to receive coolant, for example, from a supply manifold.

Referring to FIG. 4, server chassis 400 may represent any of the servers described above, such as, for example, servers 110A-110C of FIG. 1. In one embodiment, server chassis 400 may include a server frame 405 having an electronics board 412 (e.g., a PCB, motherboard, etc.) is mounted thereon. The electronics board 412 may include mounted thereon one or more electronic devices 414 (e.g., processors) that generate heat during operation. The server chassis 400 further includes a cooling module 422 (e.g., cooling plate or cold plate) in thermal contact with one or more of the electronic devices 414.

The cooling module 422 may include, or be coupled with, a liquid-in port 410 (also referred to as a plate inlet port) through which a coolant can flow to the cooling module 422. The inlet port 410 of cooling module 422 may be connected to an external loop (e.g., a supply manifold) via a flexible hose. One end of the flexible hose may be connected to the inlet port 410 and the other end of the flexible hose may be connected with a manual mate connector that can engage and connect with a manifold supply connector of the supply manifold as described above.

In addition, cooling module 422 further includes a plate outlet port, in this example, in a form of blind mate connector 420. The blind mate connector 420 can automatically engage and connect with a counterpart blind mate connector of a return manifold when server chassis 400 is moved downwardly against the return manifold as described above. Note that server frame 405 is configured to be an open frame for the purpose of providing a support structure to mount electronics board 412, electronic device 414, and cooling module 422. Server frame 405 does not block or interfere the immersion coolant, such as immersion coolant 104, from contacting or circulating the exterior surfaces of mount electronics board 412, electronic device 414, and cooling module 422. The blind mating connector 420 as well as the cooling module 422 may require to be fixed or assembled to the server chassis, such as server frame 405, to enable a robust structure design for blind mating. If the blind mating connector on the cooling module is only mounted to the elextronic device 414, during the blind mating engagement, it might damage the elextronic device 414.

Figure 5A:
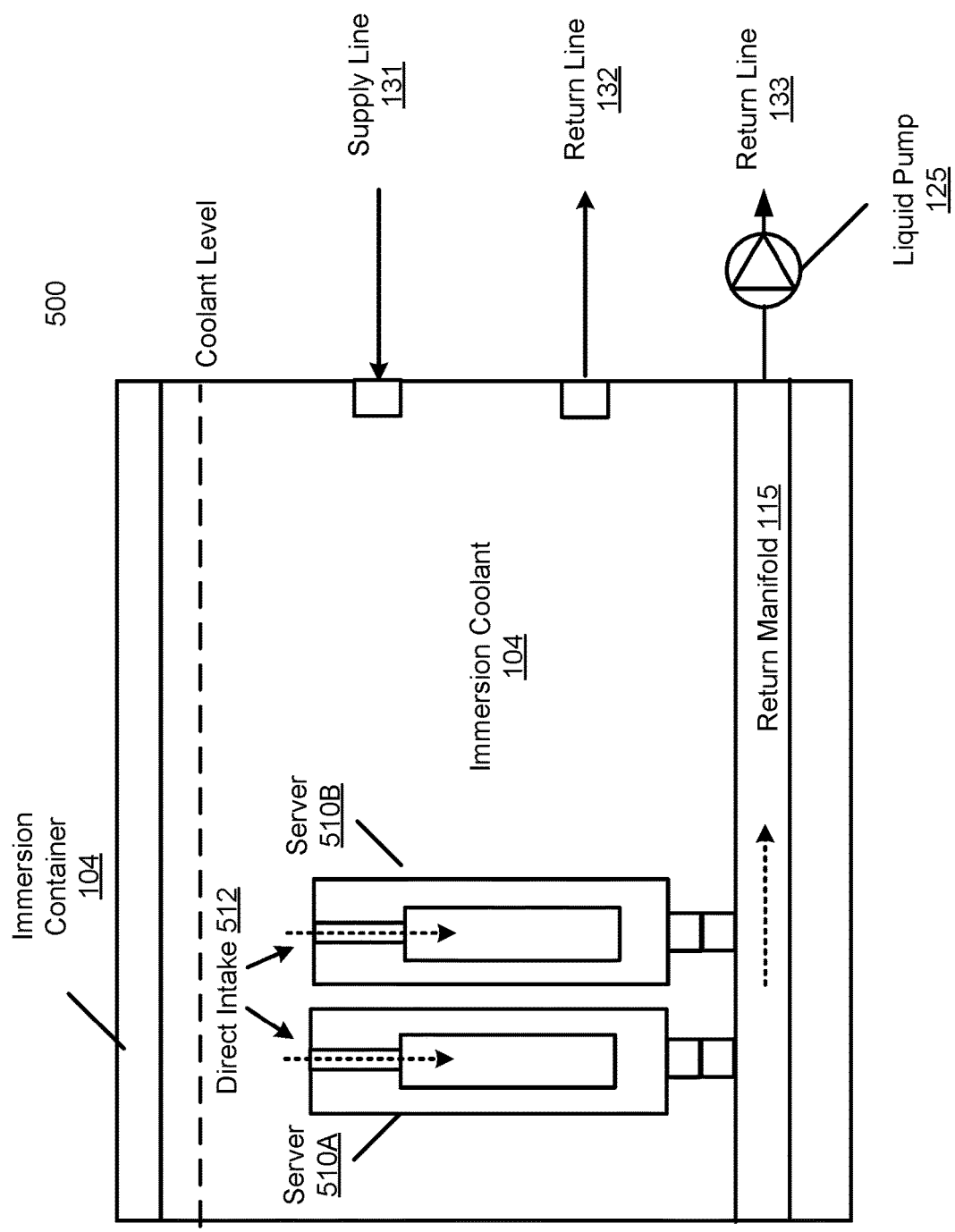
FIG. 5A is an immersion cooling system with servers having internal cooling modules with direct intake openings for local cooling loops, according to another embodiment.

FIG. 5A shows a cooling system design in which only a return manifold is used for forming a cooling loop and each of the servers, which are submerged in a single phase coolant, include a direct fluid intake. Each server may thus directly intake fluid from the immersion tank once connected to the return manifold. For example, the return manifold may include or be coupled to a fluid pump to draw fluid through connected servers. Thus, the return manifold acts as a fluid acceleration device to pull the fluid from the immersion tank into the direct intakes of the servers and through the internal channels of the servers.

In one embodiment, referring to FIG. 5A, a cooling system 500 may include an immersion container 102 filled with immersion coolant 104. The immersion container 104 may be populated with servers 510A-510B (collectively referred to as servers 510) that are coupled with a return manifold 115 by one or more blind mating connectors as described above. The servers 510 each include a direct intake 510 through which a portion of the coolant 104 can be drawn to cooling modules for cooling electronics of the servers 510, when servers 510 are submerged entirely in coolant 104. For example, the liquid pump 125 may pull a portion of immersion coolant 104 into the direct intake 512 of each of the servers 510. The coolant may then be drawn through cooling modules of the servers 510 extracting heat from the electronic devices of the servers 510 to the coolant. The coolant then travels to the return manifold 115 and returned to an external source or cooling unit. As depicted, the servers 510 may be fully submerged within the cooling liquid 104 (e.g., the coolant level exceeds the top of the servers 510 such that the coolant can be pulled into the direct intakes 510 at the top of the servers 510.

Figure 5B:
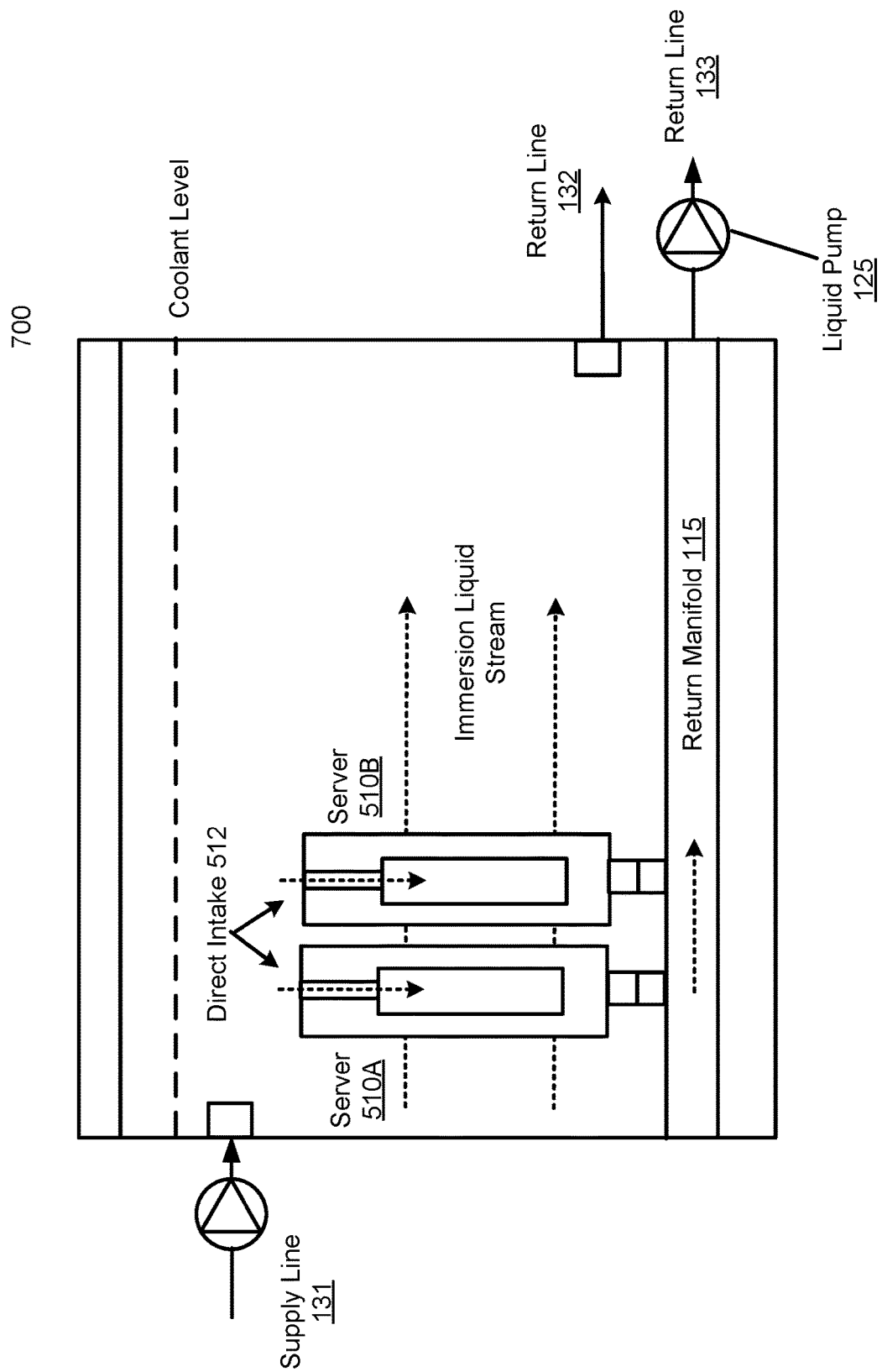
FIG. 5B is an immersion cooling system with servers having internal cooling modules with direct intake openings for local cooling loops, according to one embodiment.

In this configuration, a single coolant supply is used for providing coolant to an IT enclosure (e.g., an immersion cooling tank). The coolant provides for an immersion stream within the immersion tank which has a main outlet to a central return. The system includes a return manifold on the IT enclosure and server level advanced cooling modules to form a separate cooling loop fluid stream with different flow rates, as shown in FIG. 5B. The return manifold may be operated by a fluid pump. Both the central return from the immersion tank and the return manifold loop returns the coolant to an external cooling unit which may cool and recirculate the coolant back to the immersion tank. The local supply design of the servers allows a direct fluid acceleration port independent of the supply of the IT enclosure. With individual pumps built into each cooling module the fluid stream can be accelerated to different flow rates based on different cooling requirements for the servers.

Figure 6:
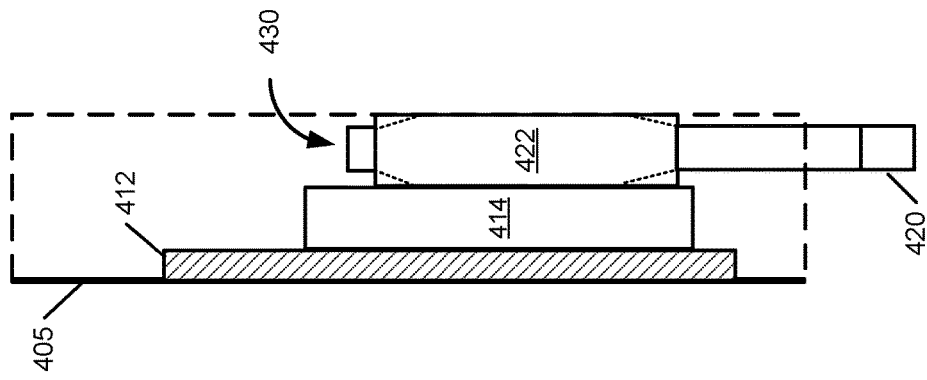
FIG. 6 is a server design with a cooling module having a direct liquid in port and liquid out ports for a local cooling loop in an immersion cooling system, according to another embodiment.
Figure 6:
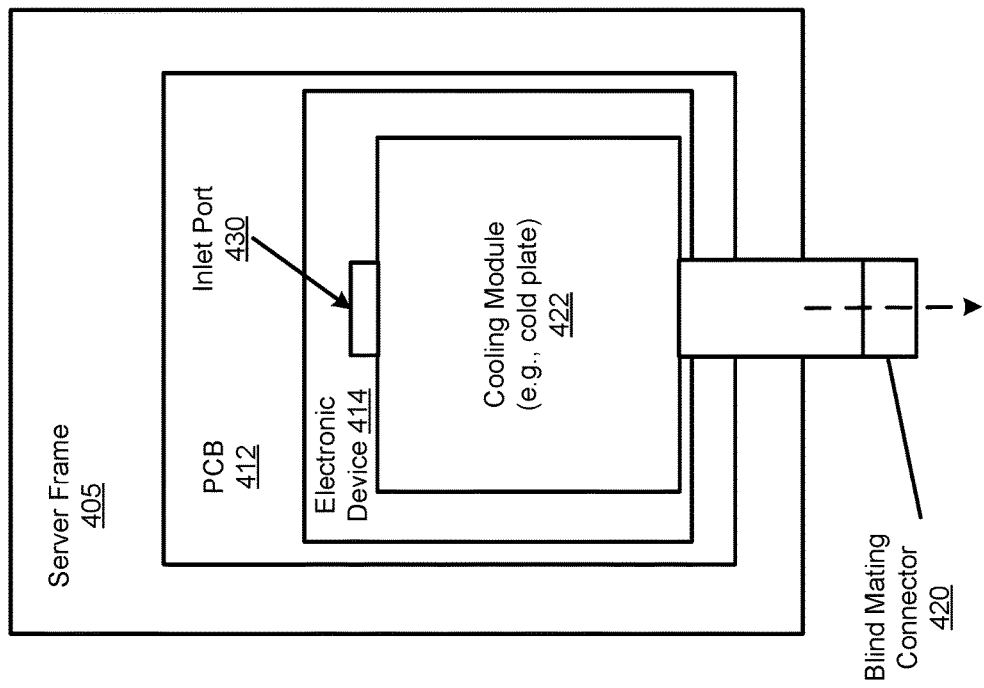

FIG. 6 depicts a server and internal server cooling module design, according to some embodiments. Such a server chassis design may represent any of servers 510 of FIGS. 5A-5B. As depicted, the server cooling module may include liquid out ports with blind mating connectors used for connecting the servers and the internal fluid channels of the servers with the return manifold. Additionally, the cooling module includes a liquid in port that is a directly open port to the immersion coolant of the immersion tank with no connectors on the side. The liquid in port may be fully submerged in the immersion fluid of the immersion tank to draw the liquid into the port, through the cooling module and to the return manifold. FIG. 4 and FIG. 6 illsutrate that the design may require server chassis and cooling module codesign for immersion coolant management and acceleration optimizations.

In one embodiment, referring to FIG. 6 and similar to FIG. 4, the inlet port 430 may be an opening between internal fluid channels and a coolant in which the server 600 is submerged. Thus, a coolant in which the server 600 is submerged may travel through the inlet port 430 to the cooling module 422, extracting heat from electronic device 414, and then exit the fluid channels to return manifold 115 to carry away the extracted heat.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An immersion cooling system, comprising:
   a container to contain first coolant therein that is received from a first cooling source;
   one or more server chassis at least partially submerged into the first coolant, wherein each of the server chassis comprises:
   an electronic device, and
   a cooling plate attached to the electronic device to extract at least a portion of heat generated by the electronic device, wherein the cooling plate comprises an inlet port to receive second coolant from a second cooling source, a coolant channel to distribute the second coolant, and an outlet port to return the second coolant back to the second cooling source; and
   a return manifold to be coupled to the second cooling source, the return manifold having one or more manifold return connectors respectively coupled with the one or more server chassis and to receive and return the second coolant from the one or more server chassis back to the second cooling source;
   wherein each of the manifold return connectors is configured to engage and connect with an outlet port of a cooling plate of a corresponding server chassis when the corresponding server chassis is submerged into the first coolant downwardly onto the return manifold.

2. The system of claim 1, wherein each outlet port of each cooling plate comprises a plate return connector, and wherein each plate return connector and each manifold return connector are blind mate connectors.

3. The system of claim 1, wherein the container further comprises:
   a main inlet port to be coupled to the first cooling source via a coolant supply line to receive the first coolant from the first cooling source; and
   a main outlet port to be coupled to the first cooling source via a coolant return line to circulate the first coolant back to the first cooling source.

4. The system of claim 1, wherein the return manifold is disposed submerged in the first coolant and located near a bottom of the container and underneath the one or more server chassis.

5. The system of claim 1, further comprising a supply manifold disposed above the one or more server chassis to receive the second coolant from the second cooling source, wherein the supply manifold includes one or more manifold supply connectors, each being coupled to an inlet port of a cooling plate of the server chassis to supply the second coolant to the one or more server chassis.

6. The system of claim 5, further comprising a first fluid pump coupled between the supply manifold and the second cooling source to pump the second coolant into the supply manifold.

7. The system of claim 6, wherein the first fluid pump is configured to receive and pump the second coolant from the first coolant contained within the container.

8. The system of claim 5, further comprising a second fluid pump disposed between at least one cooling plate and the supply manifold to pump the second coolant from the supply manifold to a corresponding server chassis.

9. The system of claim 5, further comprising a plate supply connector coupled to an inlet port of each cooling plate via a flexible hose, wherein the plate supply connector is capable of being connected with one of the manifold supply connectors of the supply manifold.

10. The system of claim 1, wherein the first cooling source and the second cooling source are the same cooling source, which is external to the container.

11. The system of claim 1, wherein an inlet port of each cooling plate is submerged into the first coolant contained within the container to receive a portion of the first coolant as the second coolant.

12. A server chassis for immersion cooling, comprising:
a server frame;
a printed circuit board (PCB) mounted on the server frame, the PCB having one or more electronic devices mounted thereon; and
one or more cooling plates respectively attached to the one or more electronic devices to extract heat generated from the electronic devices, wherein the server frame, the PCB having the electronic devices, and the cooling plates are to be submerged into first coolant received from a first cooling source and contained within an immersion tank,
wherein each of the cooling plates comprises:
an inlet port to receive second coolant from a second cooling source,
a coolant channel to distribute the second coolant, and
an outlet port to return the second coolant back to the second cooling source, wherein the outlet port is to be coupled to a return manifold within the immersion tank that is coupled to the second cooling source, the return manifold having a manifold return connector to be coupled with the outlet port and to receive and return the second coolant from the cooling plate back to the second cooling source;
wherein the manifold return connector is configured to engage and connect with the outlet port of the cooling plate when the server chassis is submerged into the first coolant downwardly onto the return manifold.

13. The server chassis of claim 12, wherein the outlet port comprises a plate return connector, and wherein the plate return connector and the manifold return connector are blind mate connectors that can engage and connect with each other.

14. The server chassis of claim 12, wherein the inlet port of the cooling plate is coupled to a plate supply connector via a flexible hose, and wherein the plate supply connector can be connected with a supply manifold to receive the second coolant.

15. A cooling plate for immersion cooling, comprising:
a base plate to be attached to an electronic device of a server chassis, wherein the server chassis having the electronic device is to be submerged into first coolant received from a first cooling source and contained in an immersion container;
an inlet port to receive second coolant from a second cooling source,
a coolant channel to distribute the second coolant, and
an outlet port to return the second coolant back to the second cooling source, wherein the outlet port is to be coupled to a return manifold within the immersion container that is coupled to the second cooling source, the return manifold having a manifold return connector to be coupled with the outlet port and to receive and return the second coolant from the cooling plate back to the second cooling source;
wherein the manifold return connector is configured to engage and connect with the outlet port when the server chassis is submerged into the first coolant downwardly onto the return manifold.

16. The cooling plate of claim 15, wherein the outlet port comprises a plate return connector, and wherein the plate return connector and the manifold return connector are blind mate connectors that can engage and connect with each other.

17. The cooling plate of claim 15, wherein the inlet port is coupled to a plate supply connector via a flexible hose, and wherein the plate supply connector can be connected with a supply manifold to receive the second coolant.

* * * * *